(12) United States Patent
Bakhshi et al.

(10) Patent No.: US 7,966,529 B2
(45) Date of Patent: Jun. 21, 2011

(54) SYSTEM AND METHOD FOR TESTING MEMORY BLOCKS IN AN SOC DESIGN

(75) Inventors: Rakesh Bakhshi, Faridabad (IN); Bipin Duggal, New Delhi (IN); Gulshan Kumar Miglani, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 703 days.

(21) Appl. No.: 11/854,547

(22) Filed: Sep. 13, 2007

(65) Prior Publication Data

US 2008/0091989 A1    Apr. 17, 2008

(30) Foreign Application Priority Data

Oct. 16, 2006  (IN) .......................... 2263/DEL/2006

(51) Int. Cl.
*G11C 29/00* (2006.01)
*G01R 31/28* (2006.01)
*G06F 9/00* (2006.01)
*G06F 17/50* (2006.01)

(52) U.S. Cl. ............. 714/718; 714/726; 713/2; 716/101

(58) Field of Classification Search .................. 714/733, 714/726, 724, 718, 30, 727
See application file for complete search history.

(56) References Cited

U.S. PATENT DOCUMENTS

| | | | | |
|---|---|---|---|---|
| 5,734,613 A * | 3/1998 | Gibson | | 365/189.04 |
| 6,070,252 A | 5/2000 | Xu et al. | | |
| 6,343,207 B1 * | 1/2002 | Hessel et al. | | 455/86 |
| 6,567,325 B1 * | 5/2003 | Hergott | | 365/201 |
| 6,829,730 B2 * | 12/2004 | Nadeau-Dostie et al. | | 714/30 |
| 7,228,440 B1 * | 6/2007 | Giles et al. | | 713/168 |
| 7,284,172 B2 * | 10/2007 | Grupp et al. | | 714/726 |
| 7,313,730 B1 * | 12/2007 | Ryser | | 714/30 |
| 7,542,360 B2 * | 6/2009 | Rashed et al. | | 365/201 |
| 2003/0074620 A1 * | 4/2003 | Dorsey | | 714/733 |
| 2005/0117420 A1 * | 6/2005 | Jeon et al. | | 365/202 |
| 2005/0204239 A1 * | 9/2005 | Miyaji et al. | | 714/738 |
| 2005/0262460 A1 | 11/2005 | Goyal et al. | | |
| 2006/0080058 A1 | 4/2006 | Zimmerman et al. | | |

* cited by examiner

*Primary Examiner* — Jeffrey A Gaffin
*Assistant Examiner* — Daniel F McMahon
(74) *Attorney, Agent, or Firm* — Charles Bergere

(57) ABSTRACT

A system and method for testing a plurality of memory blocks in a System on Chip (SOC) design uses two Test Access Ports (TAPs); a user TAP and an EDA tool TAP, to provide instructions and test data to the SOC. The system includes a glue logic block, a secured logic block and a memory testing module. The glue logic block selects the user TAP at the outset of the testing phase. The secured logic block is coupled with the user TAP and generates a TAP selection signal, which controls the selection of the EDA tool TAP. The memory testing module is used to carry out the process of testing the memory blocks when the EDA tool TAP is selected.

12 Claims, 3 Drawing Sheets

US 7,966,529 B2

SYSTEM AND METHOD FOR TESTING MEMORY BLOCKS IN AN SOC DESIGN

BACKGROUND OF THE INVENTION

The present invention generally relates to an Integrated Circuit (IC), and more specifically, to a system and method for testing memory blocks in a System on Chip (SOC).

Recently, individual electronic circuits are being integrated onto a single chip, as opposed to having a variety of IC chips being assembled on a circuit board to form a system. These electronic circuits may include functional logic blocks and arrays of memory blocks. In the SOC, the testing and debugging of the functional logic blocks and the arrays of the memory blocks is a matter of major concern.

Currently, boundary-scan testing is a widely used method for testing sub-blocks in an SOC design, since it can be performed without the use of physical test probes. Boundary-scan testing of SOC designs involves boundary-scan signals, known as Test Access Ports (TAPs) signals, being applied through a fixed number of test pins on the SOC. With the acceptance of standard scan-based TAPs such as the IEEE-1149.1-1990 standard, testing SOC designs and in-chip diagnostics has become comparatively easy. A built-in self-test (BIST) is a mechanism used to automatically verify a complete SOC design or a portion of an SOC design. BIST enables automatic generation of test patterns for testing a design, as compared to manual test vector generation. A memory built-in self-test (MBIST) architecture is used to test memory blocks in an SOC design. This circumvents the problem of generating test vectors for testing memory blocks, since the procedure of generating a set of vectors for a large die area of memory in an SOC chip is complex.

Testing of the memory arrays in an SOC design often requires the help of external vendors. Electronic Design Automation (EDA) MBIST tools provided by an external vendor can be used to thoroughly test large memory arrays. However, the major disadvantage of an EDA MBIST tool is that it cannot read the TAP of the SOC design. EDA MBIST tools generate their own TAP (hereinafter referred to as an EDA tool TAP) and provide instructions and test data during the process of testing of the memory arrays. For security reasons, a typical SOC does not allow the TAPs to be combined with the EDA tool TAP. Some external vendors provide a top-level selection pin for making a selection between the SOC TAP and the EDA tool TAP. However, this results in a design that is not secure. For example, in such a design flow, it could be possible for a user to access information stored in a memory array via the EDA tool TAP.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
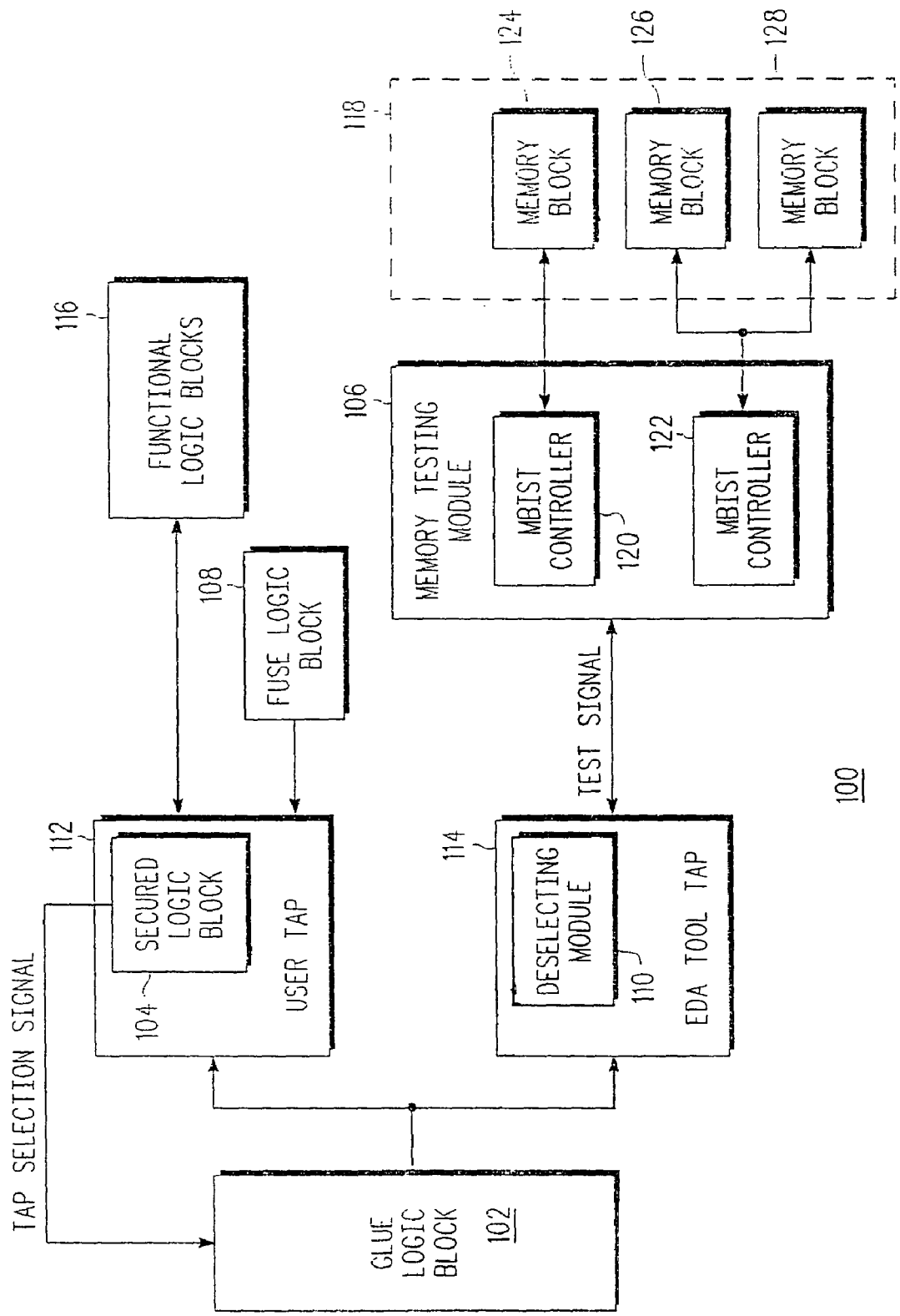
FIG. 1 is a schematic block diagram of a system for testing a plurality of memory blocks in a System on Chip (SOC), in accordance with an embodiment of the present invention.

The detailed description, in connection with the appended drawings, is intended as a description of the presently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for testing a plurality of memory blocks in a System on Chip (SOC) is provided. The SOC has a number of Test Access Ports (TAPS) including a user TAP and an Electronic Design Automation (EDA) tool TAP. The system includes a glue logic, block, a secured logic block, an EDA tool TAP, a fuse logic block, a deselecting module, and a memory testing module. The glue logic block selects the user TAP by default at the outset of a testing phase. The glue logic block selects the EDA tool TAP after programming the user TAP to provide test data during the testing of the plurality of memory blocks in the SOC. The selection of the EDA tool TAP and the user TAP is based on a TAP selection signal generated by the secured logic block.

In another embodiment of the present invention, a method for testing a plurality of on-chip memory blocks is provided. The present invention uses a user TAP and an EDA tool TAP for testing the plurality of memory blocks. The method for testing the plurality of memory blocks includes the user TAP being selected by default at the outset of the testing phase. The method also includes a TAP selection signal being generated by a secured logic block. The secured logic block is associated with the user TAP, which is programmed to generate a TAP selection signal. The EDA tool TAP is selected, based on the TAP selection signal generated by the user TAP, and is used to provide test data during the process of testing the plurality of memory blocks.

In yet another embodiment of the present invention, a circuit for providing test data to a plurality of memory blocks in an SOC is provided. The circuit includes a user TAP, an EDA tool TAP, a first selector, a second selector, a tri-state buffer, one or more inverters and buffers, and one or more logic gates. Each of the user TAP and the EDA tool TAP has a Test Data Input (TDI) pin, a Test Clock (TCK) pin, a Test Mode Select (TMS) pin and a Test Reset (TRST) pin, which receive inputs from the corresponding pins of a JTAG boundary port. Further, the user TAP and the EDA tool TAP have a Test Data Output (TDO) pin and a Test Data Output Enable (TDO_EN) pin, which are used to provide instructions and test data to the SOC. The first selector is connected to the user TAP and the EDA TAP and receives signals from the TDO pins of the user TAP and the EDA TAP. The second selector is connected to the user TAP and the EDA TAP and receives signals from the TDO_EN pins of the user TAP and the EDA TAP. The tri-state buffer is connected to the first selector and the second selector and provides signals from the TDO pins of either the user TAP or the one EDA tool TAP, based on the logic level of the TDO_EN signal of the user TAP and the EDA tool TAP. The one or more inverters and buffers transmit the signals of a JTAG boundary port to the pins of at least one user tap and one EDA tool TAP. The one or more Logic gates perform the process of gating the signals from the one or more inverters and buffers with the TAP selection signal, and providing the gated signal to at least one pin of the user TAP and one pin of the EDA tool TAP.

Various embodiments of the present invention provide a system and method for testing a plurality of memory blocks in the SOC design. The present invention prevents non-privileged access to the chip by incorporating a user TAP-controllable EDA tool TAP in the SOC and inhibits manual intervention in the selection of the TAPS. The present invention provides a mechanism for the automatic generation of test vectors, which has the ability to use the user TAP and the EDA tool TAP with the enhanced security in the SOC design. The present invention can be incorporated into any EDA MBIST tool of an SOC. The present invention facilitates the generation of test patterns used to test the SOC logic blocks as well as internal memory arrays. Further, the present invention can be used by an SOC design team, along with their in-house tool and the EDA tool provided by an external vendor, to test the SOC.

Referring now to FIG. 1, a schematic block diagram of a system for testing a plurality of memory blocks in a SOC 100 is shown, in accordance with the present invention. FIG. 1 includes a glue logic block 102, a secured logic block 104, a memory testing module 106, a fuse logic block 108, a deselecting module 110, a user Test Access Port (TAP) 112, an Electronic Design Automation (EDA) tool TAP 114, a plurality of functional logic blocks 116, and a plurality of memory blocks 118. The memory testing module 106 includes a memory built-in self-test (MBIST) controller 120 and an MBIST controller 122. The plurality of memory blocks 118 includes memory blocks 124, 126, and 128. Although three memory blocks are shown, the SOC 100 could have more memory blocks. Thus, it should be understood that three memory blocks is merely exemplary. The MBIST controller 120 is coupled with the memory block 124 to provide control signals for scan-testing the memory block 124. Similarly, the MBIST controller 122 is coupled with the memory blocks 126 and 128.

The present invention uses the two TAPS, the user TAP 112 and the EDA tool TAP 114, in the process of boundary-scan testing of the SOC 100. The user TAP 112 is controlled by a JTAG controller and performs scan testing on the functional logic blocks 116. The EDA tool TAP 114 is for use by an external tool vendor to perform scan testing on memory blocks 118. The EDA tool TAP 114 is controlled by an EDA tool JTAG controller. The glue logic block 102 provides an interface between the pins of a JTAG boundary port of the SOC 100 (not shown in FIG. 1) and the user TAP 112 and the EDA tool TAP 114. The glue logic block 102 selects the user TAP 112 at the beginning of the testing phase of the SOC design flow. In one embodiment of the invention, the user TAP 112 is selected by default at power on reset (POR). The selection of the EDA tool TAP 114 is performed according to the programming of the user TAP 112. In an embodiment of the present invention, the programming of the user TAP 112 is embedded in the user TAP 112 and involves the generation of a TAP selection signal from the secured logic block 104. In an embodiment of the present invention, the secured logic block 104 is inside the user TAP 112. It will be apparent to a person skilled in the art that the secured logic block 104 can also be placed outside the user TAP 112. In another embodiment of the invention, the user TAP 112 is hidden and not visible to the EDA tool vendor. When the EDA tool TAP 114 is used, the glue logic block 102 automatically makes a connection between the hidden user TAP and the EDA tool TAP 114 such that the selection of the EDA tool TAP 114 depends on the signal generated through the user TAP. Generation of the TAP selection signal through the secured logic block 102 implies that the SOC 100 has been implemented in the single TAP mode. Thus, the user TAP 112 is hidden and is not visible to the EDA tool.

The fuse logic block 108 may be an e-fuse or a laser fuse. As long as the fuses are not blown, data can be accessed through the TDO of the Secured User TAP 112. Once memory testing is completed through the EDA tool TAP 114, security fuses in the fuse logic block 108 are blown, disabling the EDA tool TAP 114 so that the memory can no longer be accessed via the EDA tool TAP 114.

The deselecting module 110 is coupled with the EDA tool TAP 114. The deselecting module 110 is responsible for deselecting the MBIST controllers 120 and 122 in the memory testing module 106 to prevent testing of the memory blocks associated with the MBIST controller. For example, the deselecting module 110 is used to deselect the MBIST controller 120, which, in turn, prevents the testing of the memory block 124. The deselecting module 110 also selects one or more operating modes from the plurality of operating modes of an MBIST controller in the memory testing module 106. For example, when the MBIST controller 120 is selected, the deselecting module 110 enables the MBIST controller 120 to operate in only certain selected modes. For example through this deselecting module only Production mode i.e. Pass/Fail information is provided to the end user, disabling other modes e.g., Bitmap/Diagnostic (used to obtain the contents of the memory), Memory Repair, etc.

Figure 2:
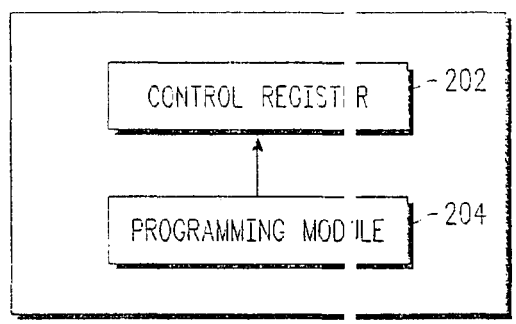
FIG. 2 is a schematic block diagram of a Secured Logic Block, in accordance with an embodiment of the present invention.

Referring now to FIG. 2, a schematic block diagram of a secured logic block 104 is shown, in accordance with the present invention. The secured logic block 104 includes a control register 202 and a programming module 204. The control register 202 stores one or more bits representing the logic level of the TAP selection signal. The programming module 204 is coupled to the control register 202 and generates control signals for updating the one or more bits representing the logic level of the TAP selection signal. In an embodiment of the present invention, the programming module 204 is programmed via the pins of the JTAG boundary port. In an embodiment of the present invention, programming the programming module 204 includes specifying the intervals of time for generating the control signals to update the one or more bits.

Figure 3:
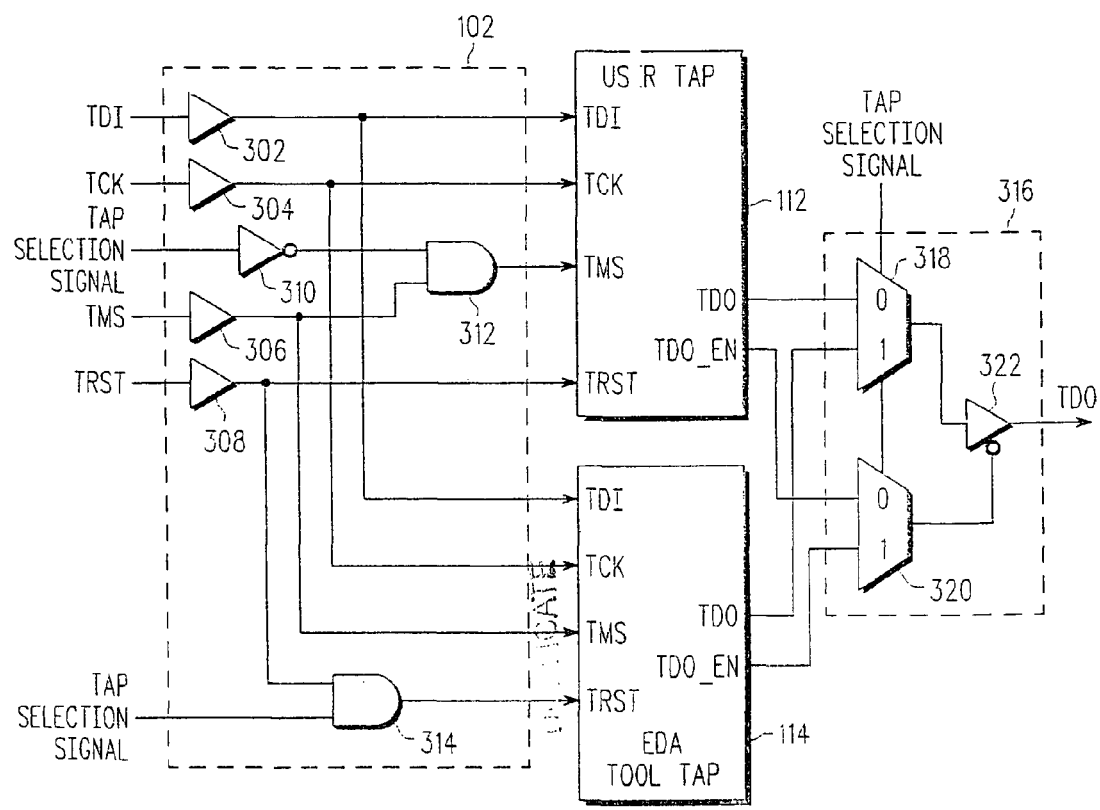
FIG. 3 is a schematic block diagram illustrating the selection of a user TAP and an EDA tool TAP, in accordance with an embodiment of the present invention.

Referring now to FIG. 3, a schematic block diagram of a circuit 300 for illustrating the selection of the user TAP 112 and the EDA tool TAP 114 of the SOC 100 is shown, in accordance with the present invention. The circuit 300 includes the glue logic block 102, the user TAP 112, the EDA TAP 114, and a dual-TAP output circuit 316. The glue logic block 102 includes inverters, buffers, and logic gates. The inverters and buffers represented in FIG. 3 are buffers 302, 304, 306, and 308, an inverter 310, and AND gates 312 and 314. The glue logic block 102 provides an interface between the JTAG boundary port and the user TAP 112 and the EDA tool TAP 114. In an embodiment of the present invention, the JTAG boundary port is at the periphery of the SOC 100, with pins for Test Data Input (TDI), Test Clock (TCK), Test Mode Select (TMS) and Test Reset (TRST) signals. These signals are used to scan test the SOC 100. For example, a user provides test instructions and test data to the SOC 100 through the JTAG boundary pins. The user TAP 112 and the EDA tool TAP 114 each have four input pins: TDI, TCK, TMS and TRST, and two output pins, Test Data Output (TDO) and Test Data Output Enable (TDO_EN). The glue logic block 102 interfaces the JTAG boundary pins to the pins of the user TAP 112 and the EDA tool TAP 114. The TDI and the TCK pins of the JTAG boundary port are directly connected to the TDI and the TCK pins of both the user TAP 112 and the EDA tool TAP 114 via the buffer 302. The TRST pin of the JTAG boundary port is directly connected to the TRST pin of the user TAP 112 via a buffer 308. The signal from the TRST pin of the JTAG boundary port is gated with a TAP selection signal via the AND gate 314 and connected to the TRST pin of the EDA tool TAP 114. The TAP selection signal is generated by the user TAP 112. The TMS pin of the JTAG boundary port is directly connected to the TMS pin of the EDA tool TAP 114 via the buffer 306. The signal from the TMS pin of the JTAG boundary port is gated with an inverted TAP selection signal, using the AND gate 312, and the gated signal is connected to the TMS pin of the user TAP 112. The user TAP 112 and the EDA tool TAP 114 both have a test data output (TDO) pin, which is used to output serial data from the user. TAP 112 and the EDA tool TAP 114.

The dual-TAP output circuit 316 selects the output of either the user TAP 112 or the EDA tool TAP 114, based on whichever TAP has been selected by the TAP selection signal. The dual-TAP output circuit 316 includes a first selector 318, a second selector 320, and a tri-state buffer 322. The first selector 318 is a 2:1 multiplexer and accepts the TDO signals of the user TAP 112 and the EDA tool TAP 114 as inputs. The output of the first selector 318 is provided to the input of the tri-state buffer 322. The second selector 320 is a 2:1 multiplexer and its inputs are connected to the TDO_EN pins of the user TAP 112 and the EDA tool TAP 114. The output of the second selector 320 is connected to the control pin of the tri-state buffer 322. The TAP selection signal is provided to the selection pin of the first selector 318 and the second selector 320. One of the outputs of either the user TAP 112 or the EDA tool TAP 114 is selected at a time, based on the TAP selection signal. The selection of one of the outputs is also controlled by the TDO_EN pins of the user TAP 112 and the EDA tool TAP 114. For example, when the TAP selection signal is at a high logic level, the first selector 318 passes the TDO signal of the EDA tool TAP 114 to the input of the tri-state buffer 322, and the second selector 320 passes the TDO_EN of the EDA tool TAP 114 to the control pin of the tri-state buffer 322. When the testing phase of the SOC 100 is initiated, the TRST pin of the JTAG boundary port is asserted, the user TAP 112 is in the active mode, and the EDA tool TAP 114 is in the reset mode. On the assertion of the TRST pin, the TAP selection signal is set at a low logic level by default, maintaining the EDA tool TAP 114 in the reset mode. In an embodiment of the present invention, the EDA tool TAP 114 remains in the reset mode for as long as the TAP selection signal is maintained at a low logic level. In other words, after the initiation of the testing phase of the SOC 100, the user TAP 112 is the only selected TAP, and the selection of the EDA tool TAP 114 is dependent on the TAP selection signal. The TAP selection signal is generated as a result of the programming of the user TAP 112 by the programming module 204.

The selection of the EDA tool TAP 114 is controlled by the secured logic block 104 of the user TAP 112. To initiate testing a memory block of the plurality of memory blocks 118, the user TAP 112 is programmed such that the TAP selection signal rises to a high logic level. When the TAP selection signal rises to a high logic level, the signal at the TMS pin of the user TAP 112 changes to a Run Test Idle (RTI) state and the EDA tool TAP 114 changes to the active state from the reset state. The user TAP 112 remains in the RTI state when the TAP selection signal is maintained at a high logic level. Therefore, in this case, the EDA tool TAP 114 is the only TAP selected. It will be apparent to a person skilled in art that the preceding description of FIG. 3 is for exemplary purposes only. The arrangement of components in the glue logic block 102 in FIG. 3 is just one way of gating a TAP selection signal. It will be understood by a person skilled in the art that other combinations of logic gates and multiplexers can be used to keep only one TAP in an active mode at a time.

Figure 4:
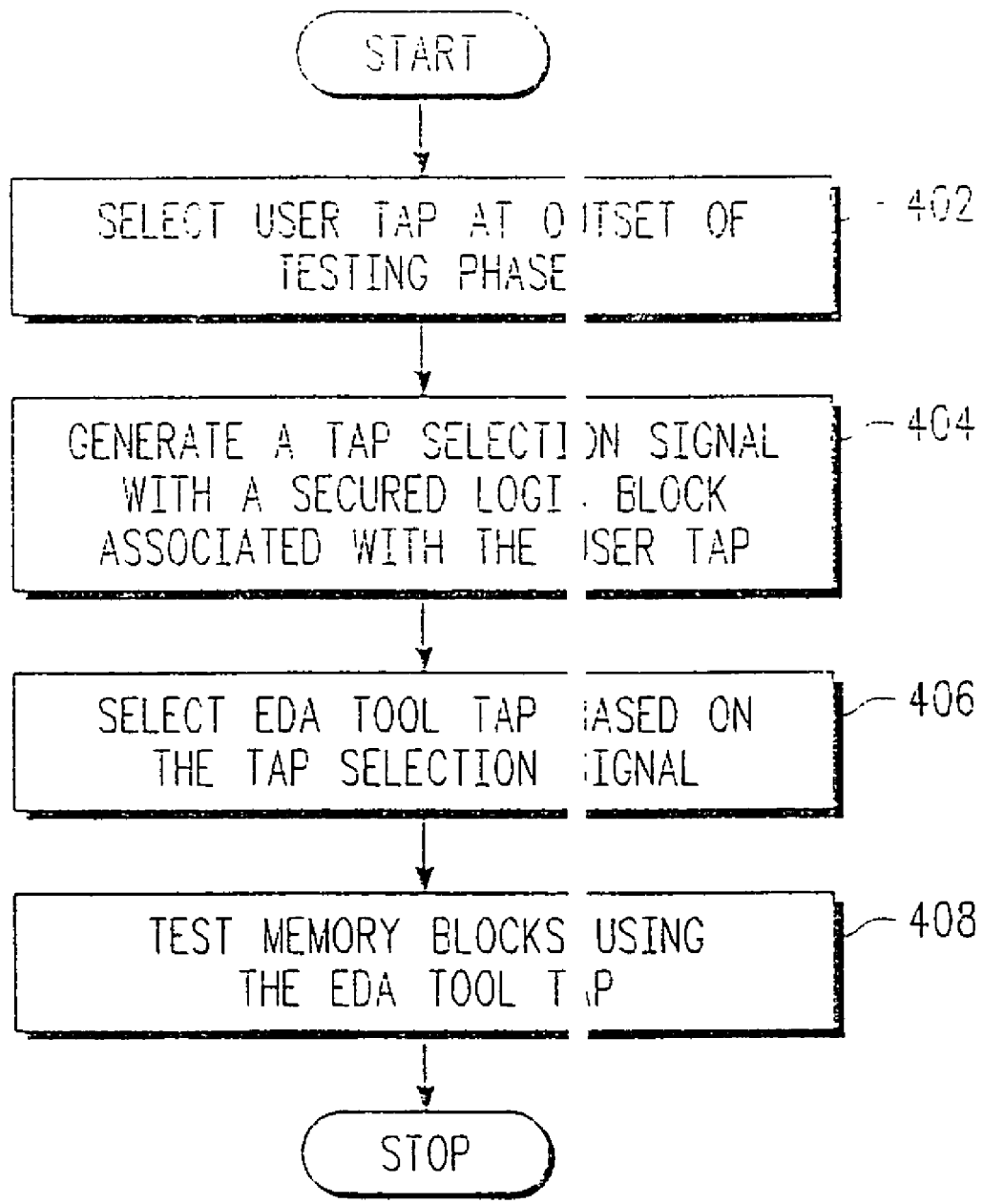
FIG. 4 is a flowchart depicting a method for testing a plurality of memory blocks in an SOC having at least two Test Access Ports (TAPs), in accordance with an embodiment of the present invention.

FIG. 4 is a flowchart depicting a method for testing a plurality of memory blocks in an SOC 100 using two Test Access Ports (TAPS), in accordance with the present invention. At step 402, a user TAP 112 is selected at the outset of a testing phase. In one embodiment of the invention, the selection of the user TAP 112 is carried out by default at the beginning of the testing phase. The user TAP 112 is associated with the functional logic locks of the SOC. At step 404, a TAP-selection signal is generated by a secured logic block associated with the user TAP 112. At step 406, the EDA tool TAP 114 is selected, based on the TAP selection signal. The step of selecting the EDA tool TAP 114 also includes the step of deselecting the user TAP 112. At step 408, the plurality of memory blocks 118 is tested through the EDA tool TAP 114. Testing the plurality of memory blocks 118 includes applying test data to the memory blocks 118. The method also includes deselecting the EDA tool TAP 114 upon completion of the testing phase of the plurality of memory blocks 118. In an embodiment of the present invention, the method includes the option of selecting one or more memory blocks of the plurality of memory blocks and at least one operating mode of the plurality of operating modes of the testing phase.

While various embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

The invention claimed is:

1. A system for testing a plurality of memory blocks in a System on Chip (SOC) having at least two Test Access Ports (TAPs), the two TAPs including a user TAP and an Electronic Design Automation (EDA) tool TAP, wherein the EDA tool TAP is used to access and test the memory blocks of the SOC, and wherein the user TAP and the EDA tool TAP are accessed using one set of JTAG pins including a TDI, TCK, TMS and TRST pin, the system comprising:

a glue logic block that selects the user TAP at an outset of a testing phase and after programming the user TAP selects the EDA tool TAP to provide test data received via the TDI pin to the plurality of memory blocks during testing of the plurality of memory blocks;

a secured logic block in communication with the user TAP by way of the glue logic block that generates a TAP selection signal, wherein the TAP selection signal is gated with the TMS pin in order to control selection of the user TAP and the EDA tool TAP and thereby prevent non-privileged access to the plurality of memory blocks via the EDA tool tap;

a memory testing module in communication with the EDA tool TAP by way of the glue logic block for facilitating testing of the plurality of memory blocks when the EDA tool TAP is selected, wherein the memory testing module receives test data from the EDA tool TAP; and a fuse logic block, including at least one fuse, connected to the secured logic block, wherein blowing the at least one fuse prevents the secured logic block from asserting the TAP selection signal, thereby disabling access to the EDA tool TAP so that the memory blocks can no longer be accessed via the EDA tool TAP.

2. The system for testing memory blocks of claim 1, wherein the glue logic block receives the TAP selection signal from the secured logic block and uses the TAP selection signal to select the EDA tool TAP.

3. The system for testing memory blocks of claim 1, wherein the secured logic block comprises:
   a control register that stores one or more bits corresponding to the TAP selection signal that control the selection of the user TAP and the EDA tool TAP; and
   a programming module connected to the control register that updates the control register based on a pre-determined criterion.

4. The system for testing memory blocks of claim 1, further comprising a dual-TAP output circuit that selects output of one of the user TAP and the EDA tool TAP based on the TAP selection signal, wherein output of the EDA tool TAP is selected to provide test data to the memory testing module.

5. The system for testing memory blocks of claim 4, wherein the dual-TAP output circuit includes at least one multiplexer to select the output of one of the user TAP and the EDA tool TAP.

6. The system for testing memory blocks of claim 1, further comprising a deselecting module coupled with the EDA tool TAP that is capable of selecting one or more memory blocks of the plurality of memory blocks and at least one operating mode of a plurality of operating modes of the testing phase.

7. A method for testing a plurality of memory blocks in a System on Chip (SOC) having a user TAP and an Electronic Design Automation (EDA) tool TAP, the method comprising:
   selecting the user TAP at an outset of a testing phase;
   generating a TAP selection signal with a secured logic block, wherein the secured logic block is associated with the user TAP and wherein the secured logic block prevents non-privileged access to the plurality of memory blocks via the EDA tool tap;
   selecting the EDA tool TAP based on the TAP selection signal to provide test data during the testing of the plurality of memory blocks; and
   testing the plurality of memory blocks using the EDA tool TAP.

8. The method for testing a plurality of memory blocks of claim 7, wherein generating the TAP selection signal comprises using at least one of a sequential logic block and a combinational logic block.

9. The method for testing a plurality of memory blocks of claim 7, wherein the step of selecting the EDA tool TAP comprises deselecting the user TAP.

10. The method for testing a plurality of memory blocks of claim 7, further comprising deselecting the user TAP and the EDA tool TAP based on the TAP selection signal after completion of the testing phase.

11. The method for testing a plurality of memory blocks of claim 7, further comprising selecting one or more memory blocks of the plurality of memory blocks and at least one operating mode of a plurality of operating modes of the testing phase.

12. A method for testing a plurality of memory blocks in a System on Chip (SOC) having a user test access port (TAP) and an Electronic Design Automation (EDA) tool TAP, wherein the EDA tool TAP is used to access and test memory blocks of the SOC, and wherein the user TAP and the EDA tool TAP are accessed using one set of JTAG pins including a TDI, TCK, TMS and TRST pin, the method comprising:
   selecting the user TAP at an outset of a testing phase;
   generating a TAP selection signal with a secured logic block, wherein the secured logic block is associated with the user TAP and prevents non-privileged access to the plurality of memory blocks via the EDA tool tap, and wherein the TAP selection signal is gated to the TMS pins of the user TAP and the EDA tool TAP;
   selecting the EDA tool TAP and deselecting the user TAP with the TAP selection signal;
   receiving test data at the TDI pin;
   testing the plurality of memory blocks with the test data using the EDA tool TAP;
   deselecting the EDA tool TAP upon completion of the testing phase; and
   blowing at least one fuse in the secured logic block so that secured logic block cannot assert the TAP selection signal, thereby disabling access to the EDA tool TAP so that the memory blocks can no longer be accessed via the EDA tool TAP.

* * * * *